(12) United States Patent
Kang et al.

(10) Patent No.: US 6,465,161 B1
(45) Date of Patent: Oct. 15, 2002

(54) METHOD FOR FORMING RESIST PATTERN

(75) Inventors: Wen-Bing Kang; Shoko Matsuo; Ken Kimura; Yoshinori Nishiwaki; Hatsuyuki Tanaka, all of Shizuoka (JP)

(73) Assignee: Clariant Finance (BVI) Limited, Tortola (VG)

( * ) Notice: Subject to any disclaimer, the term of this patent is extended or adjusted under 35 U.S.C. 154(b) by 0 days.

(21) Appl. No.: 09/600,612

(22) PCT Filed: Nov. 17, 1999

(86) PCT No.: PCT/JP99/06417

§ 371 (c)(1),
(2), (4) Date: Jul. 17, 2000

(87) PCT Pub. No.: WO00/31781

PCT Pub. Date: Jun. 2, 2000

(30) Foreign Application Priority Data

Nov. 20, 1998 (JP) ............................. 10-331505

(51) Int. Cl.[7] ................................................. G03F 7/00
(52) U.S. Cl. ........................ 430/327; 430/313; 430/322; 430/330
(58) Field of Search ................................. 430/313, 322, 430/327, 330

(56) References Cited

U.S. PATENT DOCUMENTS

| | | | | |
|---|---|---|---|---|
| 3,658,661 A | * | 4/1972 | Minklei ...................... 204/30 |
| 3,985,584 A | * | 10/1976 | Chan et al. ................. 148/6.16 |
| 4,795,582 A | * | 1/1989 | Ohmi et al. ................. 252/79.3 |
| 5,030,373 A | * | 7/1991 | Kimura et al. .............. 252/79.4 |
| 5,454,901 A | * | 10/1995 | Tsuji ........................ 156/643.1 |
| 5,614,585 A | * | 3/1997 | Matsukawa et al. ......... 524/608 |

FOREIGN PATENT DOCUMENTS

| JP | 2-228362 | * | 9/1990 |
| JP | 10-301268 | * | 11/1998 |

* cited by examiner

*Primary Examiner*—John A. McPherson
*Assistant Examiner*—Nicole Barreca
(74) *Attorney, Agent, or Firm*—Sangya Jain

(57) ABSTRACT

In a process for manufacturing integrated circuit elements or the like by photolithography, a method for reducing detrimental influence on resist shape due to properties of a substrate or acidity of substrate surface in case where a chemically amplified resist or the like is used as a photoresist, and a substrate-treating agent composition to be used for this method are described. The substrate-treating agent composition comprises a solution containing a salt between at least one basic compound selected from among primary, secondary and tertiary amines and nitrogen-containing heterocyclic compounds and an organic acid such as a sulfonic acid or a carboxylic acid. This composition is coated on a substrate surface having thereon a bottom anti-reflective coating such as SiON layer, baked and, if necessary washed, then a chemically amplified resist is coated on the thus-treated substrate, exposed and developed to form a resist pattern on the substrate.

3 Claims, 1 Drawing Sheet

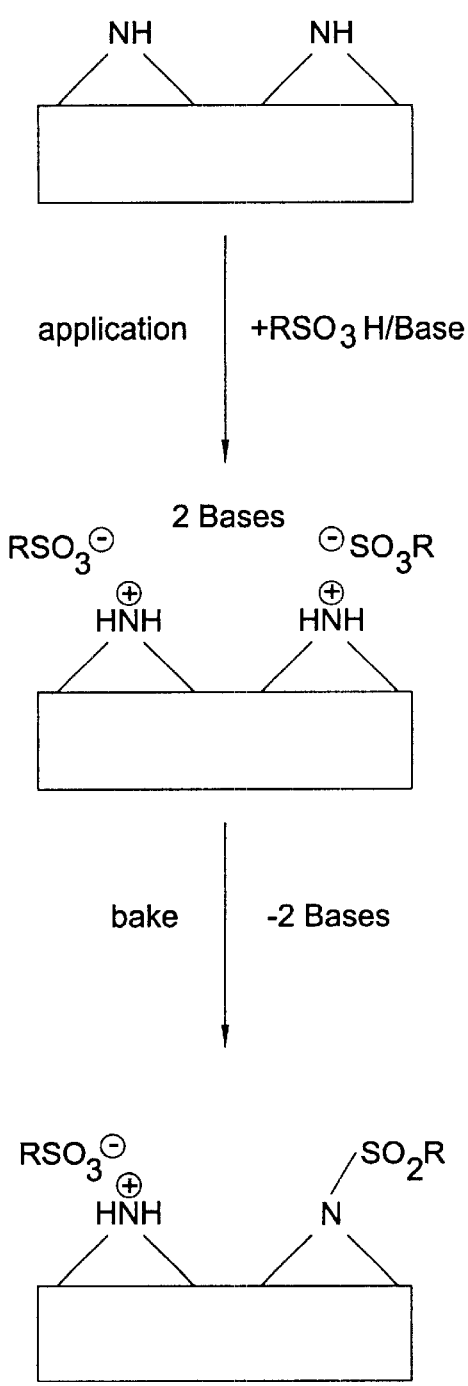
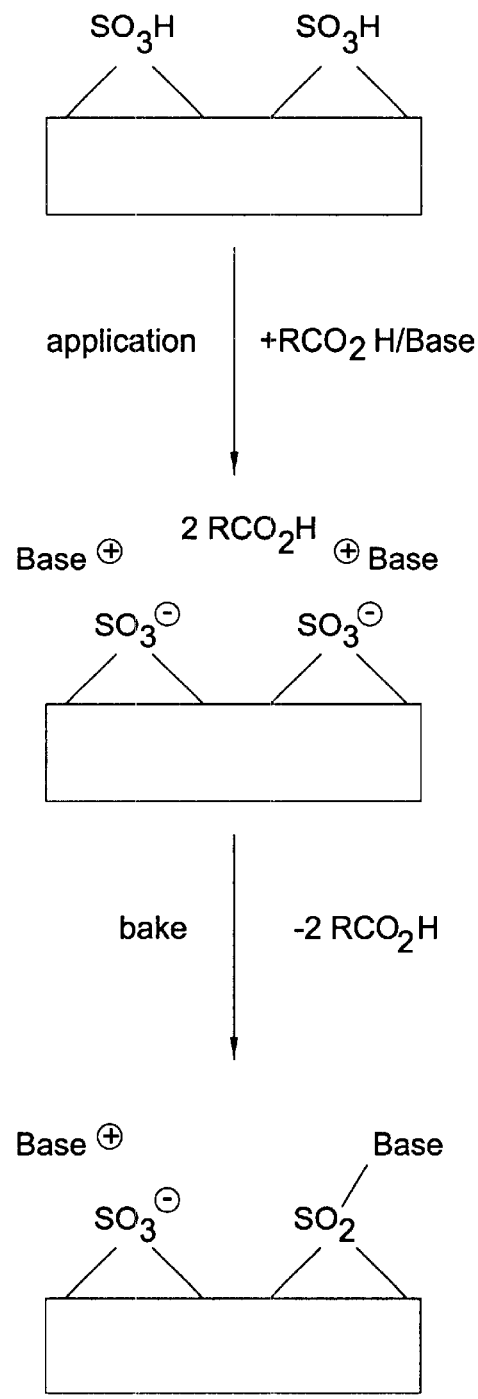
FIG. 1(a).
FIG. 1(b).

METHOD FOR FORMING RESIST PATTERN

TECHNICAL FIELD

This invention relates to a method for manufacturing integrated circuit elements, liquid crystal display elements or the like by photolithography, which reduces detrimental influence due to properties of a substrate or acidity of a substrate surface on resist form, and to a substrate-treating agent composition for use in this method.

BACKGROUND ART

In the field of manufacturing integrated circuit elements, patterning technology to form finer patterns by lithographic process has made a progress and, in recent years, development of patterning technology enabling quarter micron-ordered fine patterning has been studied. In such lithographic process, a photoresist is applied to a substrate, a latent image of a mask pattern is created in the photoresist by exposure, then the latent image is developed using a proper developer solution to obtain a desired patterned resist. However, many substrates to be used have such a high reflectivity that, upon exposure, exposing light passing through the photoresist layer is reflected on the surface of the substrate and is again incident into the photoresist layer, which causes problem that desired patterns are not obtained or that patterns with some defects are formed due to the exposure, by the reflected light, of photoresist areas which is not to be exposed or due to interference between the exposure light and the light reflected by the substrate surface. This problem is not limited to the field of manufacturing integrated circuit elements but is common in the field of conducting super-fine processing by lithographic process, such as manufacture of liquid crystal display elements.

Various techniques have been investigated to solve the problems caused by the reflection. For example, there have been attempted a technique of dispersing in the photoresist a dye having absorption at the exposure wavelength, a technique of forming a bottom anti-reflective coating (BARC) or a top surface anti-reflective coating, a technique of top surface imaging (TSI), and a technique of a multi-layer resist (MLR). Of these, the technique of forming a bottom anti-reflective coating is at present most popularly employed. As the bottom anti-reflective coating, inorganic coatings and organic coatings are known. As methods for forming the inorganic coating, there are known, for example, methods of depositing an inorganic or metallic material by CVD (Chemical Vapor Deposition), vacuum deposition, sputtering or the like. In addition, as methods for forming the organic coating, there are known, for example, a method of applying a solution or dispersion of a dye in an organic polymer solution to a substrate, and a method of applying to a substrate a solution or dispersion of a polymer dye which has a chromophore bonded chemically to a polymer. Materials of these bottom anti-reflective coating and methods for forming the coating are described in, for example, Japanese Unexamined Patent Publication (JP-A) Nos. H6-75378 and H6-118656, WO9412912, U.S. Pat. Nos. 4,910,122 and 5,057,399, etc.

The bottom anti-reflective coating serves to absorb or weaken the light having passed through the resist layer depending upon thickness and absorption properties of the bottom anti-reflective coating, thus reflection of the light having passed through the resist layer from the substrate being prevented. On the other hand, however, some materials forming the bottom anti-reflective coating leave alkaline or acidic residues or provide alkaline or acidic substituents in or on the surface of the bottom anti-reflective coating. When acidic or alkaline substances exist in or on the surface of the bottom anti-reflective coating, there arises the problem that, if a chemically amplified resist is used as photoresist, an acid generated in the resist upon exposure is neutralized and deactivated with the alkaline residues or alkaline groups in or on the surface of the bottom anti-reflective coating or that basic components in the resist react with the acidic residues or acidic groups in the bottom anti-reflective coating, resulting in deterioration of cross-sectional profile of resist patterns formed.

For example, when the bottom anti-reflective coating is formed as a nitride coating according to CVD method, sometimes surface of the nitride coating is not plain and coating composition inside the coating is not uniform. In addition, under some conditions, part of the amino groups can remain and, when remaining, the residual amino groups are non-uniformly distributed within the coating. Thus, where a chemically amplified resist is used as a photoresist, acid molecules generated in the resist layer upon exposure are partly trapped by the amino groups of the substrate, resulting in footing of resist profile with positive-working resists or resulting in undercutting (bite) with negative-working resists. On the other hand, with an anti-reflective coating composed of an organic coating, too, an acidic or alkaline component sometimes can remain on the surface of the coating and similarly causes footing or undercutting of resist profile. Such phenomena are not limited to the case where the bottom anti-reflective coating is provided, but can similarly take place in the case where other coating (e.g., ITO coating) than the bottom anti-reflective coating is formed on the substrate or where a photoresist is directly applied to the substrate. In addition, this is not limited to the case where a chemically amplified resist is used as a photoresist, but those photoresists wherein an acidic or alkaline component exists or wherein an acidic or alkaline substance is formed in the course of resist pattern-forming steps which are in turn utilized for forming a resist pattern, the resulting resist profile will be adversely affected by the substrate as with the chemically amplified resists, thus patterns with good form not being formed.

Heretofore, analysis of the surface state of these substrate materials and processing of substrate surface by plasma treatment or the like for improving adhesion of the substrate surface have been attempted. Techniques relating to improvement of such art are described in J. S. Sturtevant et al, Proc. SPIE, 2197, 770 (1994); K. Dean et al, Proc. SPIE, 2438, 514 (1995); S. Mori et al, J. Photopolymer Science and Technology, 9, 601(1996); B. C. Kim et al, Proc. SPIE, 2724, 119(1996), and the like. However, they do not describe pre-treatment technology of applying a surface-treating agent to a substrate.

An object of the present invention is to provide a method for preventing detrimental influences due to uneven acidity of or within a substrate on the form of resist pattern in case where an acidic or alkaline component exists in a photoresist like a chemically amplified resist or where a photoresist is used in which an acidic or alkaline substance is formed in the course of resist pattern-forming steps, said substance being utilized for forming a resist pattern, and a composition of a substrate-treating agent to be used in the method.

DISCLOSURE OF THE INVENTION

As a result of intensive investigations, the inventors have found that a resist pattern with no defects described above can be formed by treating a substrate with a specific treating agent before applying thereto a photoresist, thus having achieved the present invention based on the finding.

That is, the present invention is a technique of treating a substrate on which a resist pattern is to be formed, and relates to a substrate-treating agent composition composed of a solution containing a salt between at least one basic compound selected from the group consisting of primary, secondary and tertiary amines and nitrogen-containing heterocyclic compounds and an organic acid of a sulfonic acid, carboxylic acid or the like, and to a method of forming a resist pattern which comprises treating a substrate with the aforesaid substrate-treating agent composition and, after baking, applying thereto a photoresist, then conducting exposure and development.

BRIEF DESCRIPTION OF THE DRAWING

FIG. 1 shows models of treating the surface of a substrate according to the present invention, wherein (a) represents a model of treating substrate surface on which imino groups remain, and (b) a model of treating substrate surface on which sulfonic acid groups remain.

DETAILED DESCRIPTION OF THE INVENTION

The present invention will be described in more detail below.

Firstly, state of treating a substrate with the substrate-treating agent composition of the present invention will be diagramatically described by reference to the drawings.

FIG. 1(a) shows a process of treating a substrate surface on which imino groups remain. Additionally,. the above description is a mere illustration, and other basic, nitrogen-containing functional groups than the imino group, such as amine residues like amino groups, are also included. The treatment is conducted in the following manner. That is, a solution containing a salt between a basic compound and an organic sulfonic acid is applied to the substrate surface on which a photoresist is to be coated. The imino groups or the like remaining on the surface of the substrate are thereby neutralized and stabilized with the salt-forming organic sulfonic acid, while the basic compound having formed the salt with the organic sulfonic acid is isolated. When this substrate is baked at a temperature of, for example, 190° C., the isolated basic compound is decomposed and/or evaporated off, whereas part of the salt formed between the organic sulfonic acid and the residual Imino group on the substrate further undergoes amidation to form an inert residue. That is, baking serves to more inactivate the basic groups on the substrate surface to provide a substrate having no free imino groups, amino groups, etc. on the surface thereof. Additionally, in the example shown in the drawing, the free base in the substrate -treating agent composition is evaporated away by the baking.

On the other hand, in case sulfonic acid groups remain on the substrate, the substrate is treated with a solution containing a salt between an organic carboxylic acid and a basic compound, as is shown in FIG. 1(b). Thus, the salt-forming basic compound reacts with the sulfonic acid groups remaining on the substrate to neutralize and stabilize the sulfonic acid groups. Thereafter, the thus treated substrate is baked at, for example, 190° C. This baking is conducted to decompose and/or evaporate of f the isolated organic acid and simultaneously amidate part of the salt formed between the basic compound and the sulfonic acid groups on the substrate to form an inert substance such as sulfonamide remaining on the substrate.

Additionally, in the Example shown in the drawing, the salt of a substrate-treating agent reacts with a nitrogen-containing functional group or a sulfonic acid group on the substrate at an ordinary temperature. However, salts that react at a higher temperature or salts that react upon baking may also be employable.

The substrate-treating agent composition of the present invention contains a substrate-treating agent composed of a salt between at least one basic compound selected from among primary, secondary and tertiary amines and nitrogen-containing heterocyclic compounds and an organic acid such as a sulfonic acid or a carboxylic acid. These basic compounds and organic acids that constitute the substrate-treating agent will be more specifically described below.

Firstly, primary, secondary or tertiary amines to be used in the present invention are exemplified by alcoholamines such as 2-aminoethanol, diethanolamine, triethanolamine, etc.; aliphatic amines such as ethylamine, diisopropylamine, triethylamine, etc.; alicyclic amines such as dicyclohexylamine, dicyclohexylmethylamine, etc.; and aromatic amines such as aniline, methylaniline, dimethylaniline, etc. and nitrogen-containing heterocyclic basic compounds are typically exemplified by piperidine, pyridine, quinoline, etc. However, the basic compounds to be used in the present invention are not construed to be limited to these illustrated ones. Of these, tertiary amines represented by triethylamine and weakly basic compounds such as pyridine are particularly preferred.

As the organic acids to be used in the present invention, there are illustrated organic sulfonic acids such as aliphatic, alicyclic or aromatic sulfonic acids optionally having a substituent or substituents and organic carboxylic acids such as aliphatic, alicyclic or aromatic carboxylic acids optionally having a substituent or substituents. The aliphatic or alicyclic sulfonic acids include methanesulfonic acid, trifluoromethanesulfonic acid, ethanesulfonic acid, camphorsulfonic acid, cyclohexylsulfonic acid, etc. and aromatic sulfonic acids include benzenesulfonic acid, toluenesulfonic acid, nitrobenzenesulfonic acid, naphthalenesulfonic acid, xylenesulfonic acid, dodecylbenzenesulfonic acid, hydroxybenzenesulfonic acid, etc. In addition, the sulfonic acids are not limited to monosulfonic acids, but may be polysulfonic acids wherein sulfonic acid groups are incorporated, for example, with polymer such as poly(2-acrylamido-2-methyl-1-propanesulfonic acid-co-styrene). As illustrated above, the aliphatic, alicyclic or aromatic groups constituting the organosulfonic acids may optionally be substituted by such substituents as an alkyl group, an aromatic group, a halogen atom, an amino group or the like.

On the other hand, typical examples of the organic carboxylic acids include acetic acid, trifluoroacetic acid, propionic acid, etc. As is the same with the above-described sulfonic acids, the organic carboxylic acids may be substituted at the aliphatic, alicyclic or aromatic groups constituting the organic carboxylic acids by an alkyl group, an aromatic ring group, a halogen atom, an amino group or the like, or may be polycarboxylic acids such as polymethacrylic acid.

It is needless to say that the organic acids to be used in the present invention are not limited only to those specifically illustrated above.

In the present invention, the substrate-treating agent is used in the form of a substrate-treating agent composition prepared by dissolving it in water or various solvents. The substrate-treating agent composition of the present invention may be prepared by dissolving the basic compound and the organic acid successively or simultaneously in water or a solvent, or by dissolving a previously formed salt between the basic compound and the organic acid in water or a solvent. As the solvents to be used for dissolving the substrate-treating agent, there are illustrated, for example, methoxypropanol (PGME), propylene glycol monomethyl ether acetate (PGMEA), isopropanol, γ-butyrolactone, cyclohexanone, dimethylacetamide, dimethylformamide, dimethylsulfoxide, N-methylpyrrolidone, ethyl lactate (EL) and mixtures thereof. However, the solvents to be used in the present invention are not construed to be limited to these specifically illustrated ones. Particularly preferred solvents for the substrate-treating agent composition of the present invention are EL, PGME, PGMEA and a mixed solvent of PGME and PGMEA. Additionally, in case of using a mixed solvent, kinds and ratios of the solvents are not limited as long as the mixed solvent can dissolve the substrate-treating agent.

In addition, concentration of the salt of substrate-treating agent in the substrate-treating agent composition may be such that the salt is contained in an enough amount to at least neutralize amino groups or acid groups existing on the substrate and that the treatment with the substrate-treating agent composition can be smoothly conducted in a short time. As a general guide, a concentration of 0.01 to 1 wt % is preferred, though not limitative. The surface-treating agent composition may be in a concentrated form, which may be diluted upon use to a desired concentration.

To the substrate-treating agent composition of the present invention may optionally be added a water-soluble or alkali-soluble polymer. As this water-soluble or alkali-soluble polymer, there are illustrated, for example, polyvinyl alcohol, polyacrylic acid, polyhydroxystyrene, etc. These polymers may be incorporated in the substrate-treating agent composition in a content of 0 to 10 wt %, preferably 1 to 5 wt %. Addition of the polymer serves to promote adhesion between the resist and the substrate and preservation of the substrate-treating agent.

The treatment of a substrate with the substrate-treating agent composition of the present invention is conducted by, for example, coating the substrate-treating agent composition on the surface of the substrate. Coating may be conducted in an optional manner such as spin-coating, spray-coating or dip-coating. After the treatment of the substrate with the substrate-treating agent composition, baking is conducted and, if necessary, the. substrate is treated with water or a solvent to thereby wash the substrate surface. An object of this washing is to remove unreacted salt having been provided by the coating of the substrate-treating agent. Additionally, washing of the substrate surface may be conducted prior to baking, though washing being preferably conducted after baking. Baking after the treatment must be conducted at a temperature at which the substrate surface is not adversely affected and the free acid or base isolated upon the treatment is decomposed and/or evaporated away and/or at which reaction between the salt of substrate-treating agent and the amino groups, imino groups or the like on the substrate takes place, usually at about 100 to 250° C. After the baking treatment or after the baking and washing treatment, a photoresist is coated on the thus-treated substrate, exposed and developed to form a resist pattern.

Additionally, photoresists which can provide good results when coated on a substrate having been treated with the substrate-treating agent composition of the present invention are, typically, chemically amplified resists. However, they are not limited to the chemically amplified resists, and any of those which are influenced by acidity of the substrate can provide good results when treated in accordance with the present invention.

Substrates to which the substrate-treating agent of the present invention is to be applied may be any of those conventionally known ones that allow to form a resist pattern thereon according to photolithography. Preferable examples thereof include a silicon substrate and a silicon substrate having formed thereon an oxide layer, an ITO layer, a SiON layer or the like.

BEST MODE FOR PRACTICING THE INVENTION

The substrate-treating agent composition and the method for forming a resist pattern using this substrate-treating agent composition of the present invention will now be described more specifically by reference to Examples which, however, are not to be construed to limit the present invention in any way.

EXAMPLE 1

2.32 g of camphor-sulfonic acid and 1.06 g of triethylamine were dissolved in PGMEA at room temperature so that concentration of camphor-sulfonic acid became 0.05 wt %. Then, the solution was filtered through a 0.05 μm filter to obtain substrate-treating agent composition 1.

EXAMPLE 2

1.9 g of p-toluenesulfonic acid hydrate and 1.04 g of cyclohexylamine were dissolved in PGMEA at room temperature so that concentration of p-toluenesulfonic acid hydrate became 0.05 wt %. Then, the solution was filtered through a 0.05 μm filter to obtain substrate-treating agent composition 2.

EXAMPLE 3

3.27 g of dodecylbenzenesulfonic acid and 1.06 g of triethylamine were dissolved in PGMEA at room temperature so that concentration of dodecylbenzenesulfonic acid became 0.05 wt %. Then, the solution was filtered through a 0.05 μm filter to obtain substrate-treating agent composition 3.

EXAMPLE 4

Treatment of a Substrate with a Surface-treating Agent and Patterning Test Using a Resist Adapted for KrF A SION layer was formed on a silicon wafer according to CVD method to form an anti-reflective coating. The substrate-treating agent compositions 1–3 obtained in Examples 1–3 were respectively coated on the anti-reflective coatings using a spin-coater at a rotation rate of 1000 rpm, and the thus coated substrates were baked at 190° C. for 60 seconds. Then, on each of the thus treated wafers was coated a resist adapted for KrF, DX3110, made by Clariant Co. in a thickness of 0.55 μm after pre-baking at 120° C. for 60 seconds, followed by exposing by means of a KrF stepper. After the patternwise exposure, the resist was post-baked at 110° C. for 60 seconds, and developed for 30 seconds in a 2.38 wt % aqueous solution of tetramethylammonium hydroxide (TMAH). Observation of cross section of each of the thus developed wafers under a scanning electron microscope (SEM) revealed that good-shaped resists were formed with no footing.

COMPARATIVE EXAMPLE 1

A resist pattern was formed in the same manner as in Example 4 except for not conducting the treatment with the substrate-treating agent. Observation of the thus-obtained resist pattern under SEM as in Example 4 revealed that the formed resist had much footing, thus being practically problematical.

Advantages of the Invention

According to the present invention, an alkaline substance or an acidic substance on a substrate surface can be neutralized by pre-treating a substrate having provided thereon a bottom anti-reflective coating with a substrate-treating agent composition containing a salt between a basic compound and an organic acid. This neutralization serves to hinder influence of the alkaline or acidic substance existing on the substrate surface upon a resist in case where the photoresist contains an acidic or alkaline component or where a photoresist in which an acidic or alkaline substance is formed in the course of forming a resist pattern for forming a resist pattern utilizing the acidic or alkaline substance, such as a chemically amplified resist, is coated on a substrate. Thus, shape deficiency of resist pattern due to detrimental influence of the substrate, that is, footing of resist profile or undercut, can be reduced.

Industrial Utility

As has been described hereinbefore, the substrate-treating agent composition of the present invention is used as a treating agent for reducing detrimental influences due to properties of a substrate or acidity of a substrate surface on resist formation in the process of manufacturing integrated circuit elements, liquid crystal display elements etc. according to photolithography.

What is claimed is:

1. A substrate-treating agent composition for treating a substrate on which a resist pattern is to be formed, wherein the composition consists essentially of 1) a salt between at least one basic compound selected from among primary, secondary and tertiary amines and nitrogen-containing heterocyclic compounds and an organic acid, wherein the organic acid is at least one member selected from the group consisting of substituted or unsubstituted aliphatic, alicyclic or aromatic sulfonic acids, substituted or unsubstituted alicyclic or aromatic carboxylic acids, acetic acid, trifluoroacetic acid and propionic acid; 2) a solvent or mixture of solvents; and, 3) optionally a water soluble or alkali soluble polymer.

2. A method of forming resist patterns which comprises steps of applying a photoresist onto a substrate, exposing the resulting photoresist layer and then developing it, wherein after the substrate is treated with the substrate-treating agent composition described in claim 1 and then baked, the photoresist is applied onto the substrate.

3. The method of forming resist patterns according to claim 2 the substrate after baking is treated with a solvent.

* * * * *